US011489494B2

(12) United States Patent
Kim et al.

(10) Patent No.: US 11,489,494 B2
(45) Date of Patent: Nov. 1, 2022

(54) DYNAMIC AMPLIFIER

(71) Applicant: SAMSUNG ELECTRONICS CO., LTD., Suwon-si (KR)

(72) Inventors: Yunhong Kim, Hwaseong-si (KR); Youngcheol Chae, Seoul (KR)

(73) Assignees: SAMSUNG ELECTRONICS CO., LTD., Suwon-si (KR); INDUSTRY-ACADEMIC COOPERATION FOUNDATION, YONSEI UNIVERSITY, Seoul (KR)

(*) Notice: Subject to any disclaimer, the term of this patent is extended or adjusted under 35 U.S.C. 154(b) by 64 days.

(21) Appl. No.: 16/838,100

(22) Filed: Apr. 2, 2020

(65) Prior Publication Data
US 2020/0395896 A1 Dec. 17, 2020

(30) Foreign Application Priority Data

Jun. 17, 2019 (KR) .................. 10 2019-0071552

(51) Int. Cl.
H03G 3/00 (2006.01)
H03F 3/45 (2006.01)
(Continued)

(52) U.S. Cl.
CPC ............ H03F 1/0216 (2013.01); H03F 1/56 (2013.01); H03G 3/004 (2013.01); H03F 3/45165 (2013.01); H03F 2200/555 (2013.01)

(58) Field of Classification Search
CPC .... H03F 1/0216; H03F 1/56; H03F 2200/555; H03F 2203/45318; H03F 1/3211;
(Continued)

(56) References Cited

U.S. PATENT DOCUMENTS 6,771,124 B1\* 8/2004 Ezell .................... H03G 1/0023
327/359
7,038,542 B2 5/2006 Imayama et al.
(Continued)

FOREIGN PATENT DOCUMENTS

KR          10-0990088      10/2010
KR     10-2011-0094288       8/2011
(Continued)

OTHER PUBLICATIONS

Md Shakil Akter, et al., "A Capacitively Degenerated 100-dB Linear 20-150 MS/s Dynamic Amplifier", IEEE Journal of Solid-State Circuits, 2017.

Primary Examiner — Samuel S Outten
Assistant Examiner — Khiem D Nguyen
(74) Attorney, Agent, or Firm — F. Chau & Associates, LLC

(57) ABSTRACT

A dynamic amplifier includes an amplifier configured to differentially amplify first and second input signals to generate first and second output signals, a bias circuit, and a variable impedance circuit. The bias circuit is connected between a first power node configured to supply a first source voltage and the amplifier, and configured to apply bias to the amplifier. The variable impedance circuit is connected between the amplifier and a second power node configured to supply a second source voltage that is lower than the first source voltage. The variable impedance circuit is configured to adjust amplification gain of the amplifier, by adjusting impedance based on a magnitude of one among the first and second input signals and the first and second output signals.

7 Claims, 17 Drawing Sheets

(51) Int. Cl.
*H03F 1/02* (2006.01)
*H03F 1/56* (2006.01)

(58) Field of Classification Search
CPC . H03F 2203/45394; H03F 2203/45391; H03F 3/45179; H03G 3/004; H03G 1/0029
USPC .................................................. 330/252–261
See application file for complete search history.

(56) References Cited

U.S. PATENT DOCUMENTS

| | | |
|---|---|---|
| 7,378,908 B2 | 5/2008 | Suh et al. |
| 7,414,475 B2 | 8/2008 | Kim |
| 7,696,819 B2 | 4/2010 | Cho et al. |
| 2007/0210871 A1 | 9/2007 | Kim et al. |
| 2011/0248780 A1 | 10/2011 | Berg |
| 2017/0085239 A1* | 3/2017 | Yuan ................. H04L 25/03878 |

FOREIGN PATENT DOCUMENTS

| | | |
|---|---|---|
| KR | 10-2017-0005244 | 1/2017 |
| KR | 10-2019-0006107 | 1/2019 |

* cited by examiner

| | Optimal Point | Gain | Std/Gain |
|---|---|---|---|
| Comparative Example | 4.3nS | 2.8229V/V | 7.1276e-05 |
| Example | 8.6nS(×2) | 2.6297V/V(▽6.8%) | 8.1484e-06(×8.7472) |

| | Comparative Example | Example |
|---|---|---|
| 110dB | – | 0.15% |
| 100dB | – | 0.45% |
| 90dB | 0.95 | 1.90% |
| 90dB | 3.00% | 6.00% |

DYNAMIC AMPLIFIER

CROSS-REFERENCE TO RELATED APPLICATION

This application claims priority under 35 U.S.C. § 119 to Korean Patent Application No. 10-2019-0071552, filed on Jun. 17, 2019 in the Korean Intellectual Property Office, the disclosure of which is incorporated by reference herein in its entirety.

TECHNICAL FIELD

Exemplary embodiments of the present inventive concept relate to a dynamic amplifier.

DISCUSSION OF RELATED ART

Dynamic amplifiers are widely used in various fields such as wireless communications systems and memory systems. Dynamic amplifiers have become an essential element for extending a dynamic range of a system. In devices requiring high resolution, such as pipeline analog-to-digital converters, dynamic amplifiers are required to have high linearity and to be driven at low power.

SUMMARY

According to an exemplary embodiment of the present inventive concept, a dynamic amplifier may include an amplifier configured to differentially amplify first and second input signals to generate first and second output signals, a bias circuit connected between a first power node configured to supply a first source voltage and the amplifier, and configured to apply bias to the amplifier, and a variable impedance circuit connected between the amplifier and a second power node configured to supply a second source voltage that is lower than the first source voltage. The variable impedance circuit is configured to adjust amplification gain of the amplifier, by adjusting impedance based on a magnitude of one among the first and second input signals and the first and second output signals.

According to an exemplary embodiment of the present inventive concept, a dynamic amplifier may include a first input transistor having a gate configured to receive a first input signal and a drain configured to output a second output signal, a second input transistor having a gate configured to receive a second input signal and a drain configured to output a first output signal, a first feedback transistor having a drain connected to a source of the first input transistor, and having a resistance value determined by one among the first and second input signals and the first and second output signals, a second feedback transistor having a drain connected to a source of the second input transistor, and having a resistance value determined by one among the first and second input signals and the first and second output signals, a first capacitor connected to a source of the first feedback transistor, and a second capacitor connected to a source of the second feedback transistor.

According to an exemplary embodiment of the present inventive concept, a dynamic amplifier may include an amplifier connected to a first power node configured to supply a first source voltage, and configured to differentially amplify first and second input signals according to predetermined amplification gain to output first and second output signals, a non-linearity compensator circuit connected to the amplifier, and having a resistance value which varies based on a magnitude of one among the first and second input signals and the first and second output signals, an operational mode controller connected to the non-linearity compensator circuit in parallel, and configured to control whether the non-linearity compensator circuit is activated, and an amplification gain control circuit connected between the non-linearity compensator circuit and a second power node configured to supply a second source voltage that is lower than the first source voltage. The amplification gain control circuit is configured to adjust a magnitude of the predetermined amplification gain.

BRIEF DESCRIPTION OF DRAWINGS

The above and other aspects and features of the present inventive concept will be more clearly understood by describing in detail exemplary embodiments thereof with reference to the accompanying drawings.

DETAILED DESCRIPTION OF THE EMBODIMENTS

Figure 1:
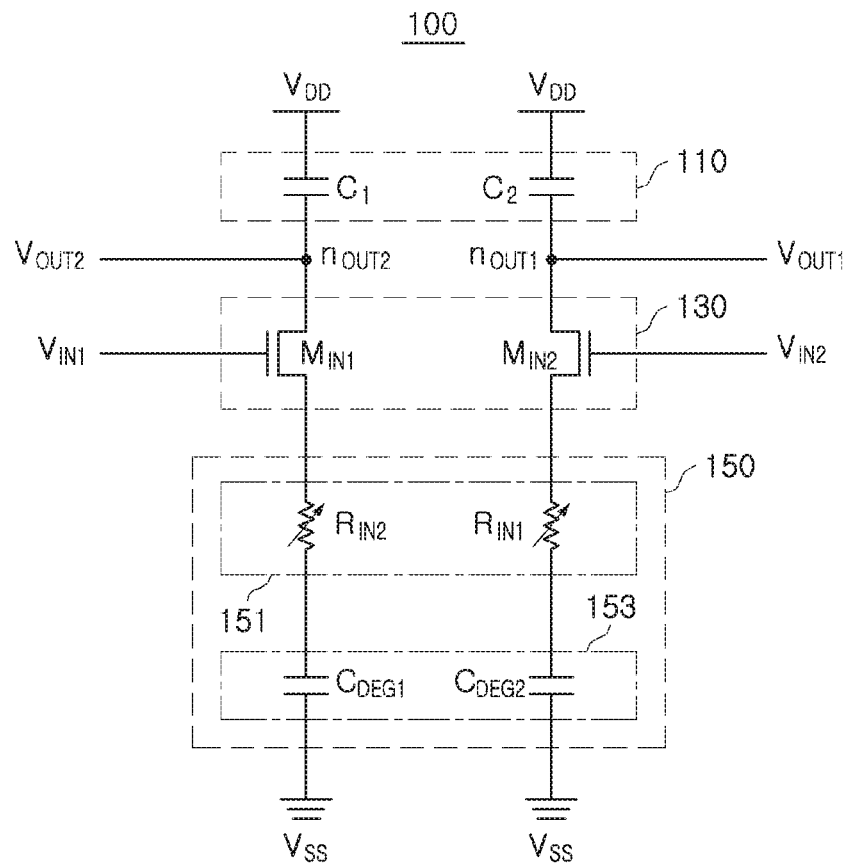
FIG. 1 is a view illustrating a dynamic amplifier according to an exemplary embodiment of the present inventive concept.

Exemplary embodiments of the present inventive concept provide a dynamic amplifier having improved linearity.

Hereinafter, exemplary embodiments of the present inventive concept will be described in detail with reference to the attached drawings Like reference numerals may refer to like elements throughout this application.

Figure 2:
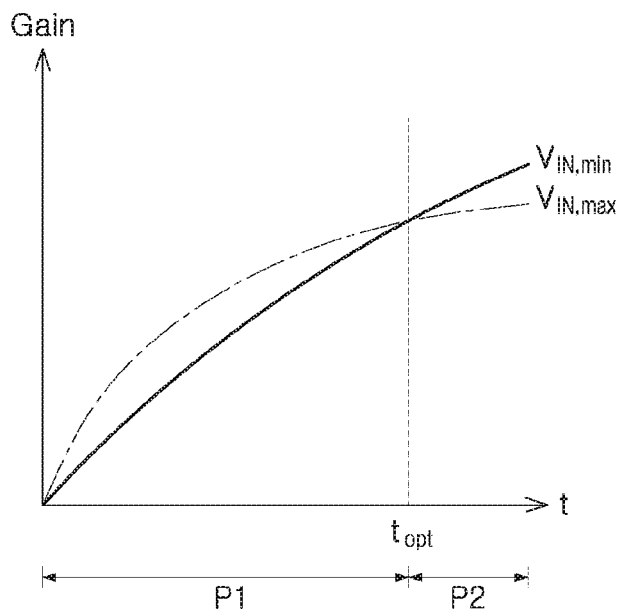
FIG. 2 is a view illustrating a change in amplification gain of a dynamic amplifier according to an exemplary embodiment of the present inventive concept.
Figure 3A:
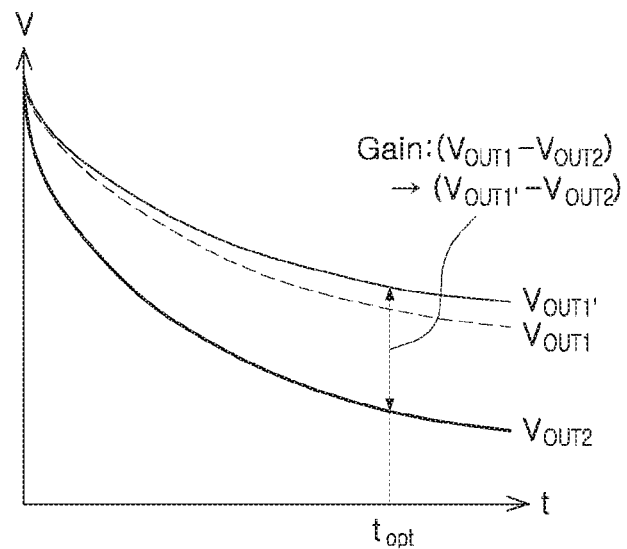
FIGS. 3A and 3B are views illustrating a change in a magnitude of an output signal of a dynamic amplifier according to exemplary embodiments of the present inventive concept.
Figure 3B:
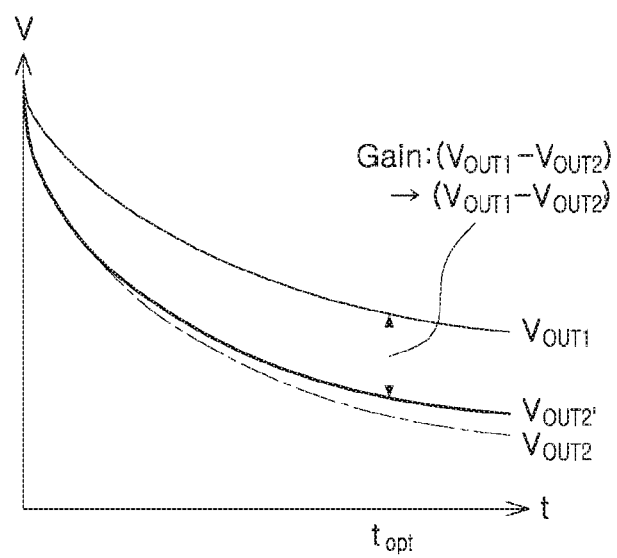

FIG. 1 is a view illustrating a dynamic amplifier according to an exemplary embodiment of the present inventive concept. FIG. 2 is a view illustrating a change in amplification gain of a dynamic amplifier according to an exemplary embodiment of the present inventive concept, and FIGS. 3A and 3B are views illustrating a change in a magnitude of an output signal of a dynamic amplifier according to exemplary embodiments of the present inventive concept.

Referring to FIG. 1, a dynamic amplifier 100 may include a bias portion 110, an amplifier 130, and a variable impedance unit 150. According to exemplary embodiments of the present inventive concept, the bias portion 110, the amplifier 130, and the variable impedance unit 150 may be circuits.

The bias portion 110 may be connected between a first power node $V_{DD}$ supplying a first source voltage and the amplifier 130, to apply bias to the amplifier 130. In an exemplary embodiment of the present inventive concept, the bias portion 110 may include a first bias capacitor $C_1$ and a second bias capacitor $C_2$, each being connected between the first power node $V_{DD}$ and the amplifier 130. The first bias capacitor $C_1$ and the second bias capacitor $C_2$ may apply bias to the amplifier 130 in a charge sharing method, and as a result, power consumption of the dynamic amplifier 100 may be reduced.

The amplifier 130 differentially amplifies a first input signal $V_{IN1}$ and a second input signal $V_{IN2}$ according to a predetermined amplification gain to generate a first output signal $V_{OUT1}$ and a second output signal $V_{OUT2}$, respectively.

In an exemplary embodiment of the present inventive concept, the amplifier 130 may include a first input transistor $M_{IN1}$ and a second input transistor $M_{IN2}$. The first input transistor $M_{IN1}$ may have a gate receiving the first input signal $V_{IN1}$, a drain connected to the bias portion 110, and a source connected to the variable impedance unit 150. The drain of the first input transistor $M_{IN1}$ may be connected to a second output node $n_{OUT2}$ where the second output signal $V_{OUT2}$ is output. The second input transistor $M_{IN2}$ may have a gate receiving the second input signal $V_{IN2}$, a drain connected to the bias portion 110, and a source connected to the variable impedance unit 150. The drain of the second input transistor $M_{IN2}$ may be connected to a first output node $n_{OUT1}$ where the first output signal $V_{OUT1}$ is output.

The variable impedance unit 150 may be connected between the amplifier 130 and a second power node $V_{SS}$ supplying a second source voltage that is lower than the first source voltage. The variable impedance unit 150 may have a resistance value determined according to a magnitude (for example, a peak-to-peak value) of at least one among the first and second input signals $V_{IN1}$ and $V_{IN2}$ and the first and second output signals $V_{OUT1}$ and $V_{OUT2}$. According to the resistance value of the variable impedance unit 150, a magnitude of at least one of the first and second output signals $V_{OUT1}$ and $V_{OUT2}$ may vary, and thus an amplification gain of the amplifier 130 may also vary. In other words, the amplification gain of the amplifier 130 may be adjusted by changing impedance between the amplifier 130 and the second power node $V_{SS}$.

In an exemplary embodiment of the present inventive concept, the variable impedance unit 150 increases or decreases a resistance value based on the relationship between magnitudes of the input signals $V_{IN1}$ and $V_{IN2}$ and the amplification gain, thus adjusting the amplification gain of the amplifier 130. For example, referring to FIG. 2, an amplification section of the dynamic amplifier 100 may be divided into a first section P1, in which the amplification gain of the amplifier 130 is increased, and a second section P2, in which the amplification gain of the amplifier 130 is decreased, as a magnitude of an input signal is increased from a first level $V_{IN,min}$ to a second level $V_{IN,max}$. In the first section P1, a resistance value of the variable impedance unit 150 may be adjusted in a direction of decreasing the amplification gain of the amplifier 130. On the other hand, in the second section P2, the resistance value of the variable impedance unit 150 may be adjusted in a direction of increasing the amplification gain of the amplifier 130.

In addition, in an exemplary embodiment of the present inventive concept, the variable impedance unit 150 increases or decreases a resistance value based on the relationship between magnitudes of the output signals $V_{OUT1}$ and $V_{OUT2}$ and the amplification gain, thus adjusting the amplification gain.

The variable impedance unit 150 may include a non-linearity compensator 151 and an amplification gain control unit 153. According to exemplary embodiments of the present inventive concept, the non-linearity compensator 151 and the amplification gain control unit 153 may be circuits.

The non-linearity compensator 151 may adjust a resistance value between the amplifier 130 and the second power node $V_{SS}$, to decrease a variation of a slope factor of the amplification gain of the amplifier 130, which may occur due to a process variable, thus compensating for an error between a target value and an actual value of the amplification gain of the amplifier 130 (an error of the amplification gain).

The non-linearity compensator 151 may include variable resistive elements $R_{IN1}$ and $R_{IN2}$, in which a resistance value is changed based on one among a pair of the output signals $V_{OUT1}$ and $V_{OUT2}$ and a pair of the input signals $V_{IN1}$ and $V_{IN2}$ of the amplifier 130. For example, the non-linearity compensator 151 may include a passive element such as a variable resistor or an inductor, or an active element such as a transistor. Specific implementation examples of the non-linearity compensator 151 will be described below in detail with reference to FIGS. 5A to 7C.

The non-linearity compensator 151 may include a first variable resistive element $R_{IN1}$ and a second variable resistive element $R_{IN2}$. The first variable resistive element $R_{IN1}$ may control current flowing between the second output node $n_{OUT2}$ and the second power node $V_{SS}$ to adjust a magnitude of the second output signal $V_{OUT2}$. The second variable resistive element $R_{IN2}$ may control current flowing between the first output node $V_{OUT1}$ and the second power node $V_{SS}$ to adjust a magnitude of the first output signal $V_{OUT1}$.

The non-linearity compensator 151 may adjust the amplification gain of the amplifier 130, by adjusting a magnitude of at least one of the first output signal $V_{OUT1}$ and the second output signal $V_{OUT2}$ based on a resistance value of at least one of the first variable resistive element $R_{IN1}$ and the second variable resistive element $R_{IN2}$.

For example, referring to FIG. 3A, the non-linearity compensator 151 may adjust a resistance value of the first variable resistive element $R_{IN1}$ to be greater than a resistance value of the second variable resistive element $R_{IN2}$ to increase a magnitude of the first output signal $V_{OUT1}$ (to $V_{OUT1'}$), thus increasing the amplification gain of the amplifier 130. In addition, referring to FIG. 3B, the non-linearity compensator 151 may adjust a resistance value of the second variable resistive element $R_{IN2}$ to be greater than a resistance value of the first variable resistive element $R_{IN1}$ to increase a magnitude of the second output signal $V_{OUT2}$ (to $V_{OUT2'}$), thus decreasing the amplification gain of the amplifier 130.

As described above, the non-linearity compensator 151 may change resistance values of the variable resistive elements $R_{IN1}$ and $R_{IN2}$ to increase or decrease the amplification gain of the amplifier 130, thus compensating for an error of the amplification gain of the amplifier 130 and improving linearity of the dynamic amplifier 100.

The amplification gain control unit 153 may adjust the amplification gain of the amplifier 130 using a reactance component between the amplifier 130 and the second power node $V_{SS}$. The amplification gain control unit 153 may include a reactance element such as a capacitor, an inductor, or the like.

Figure 4A:
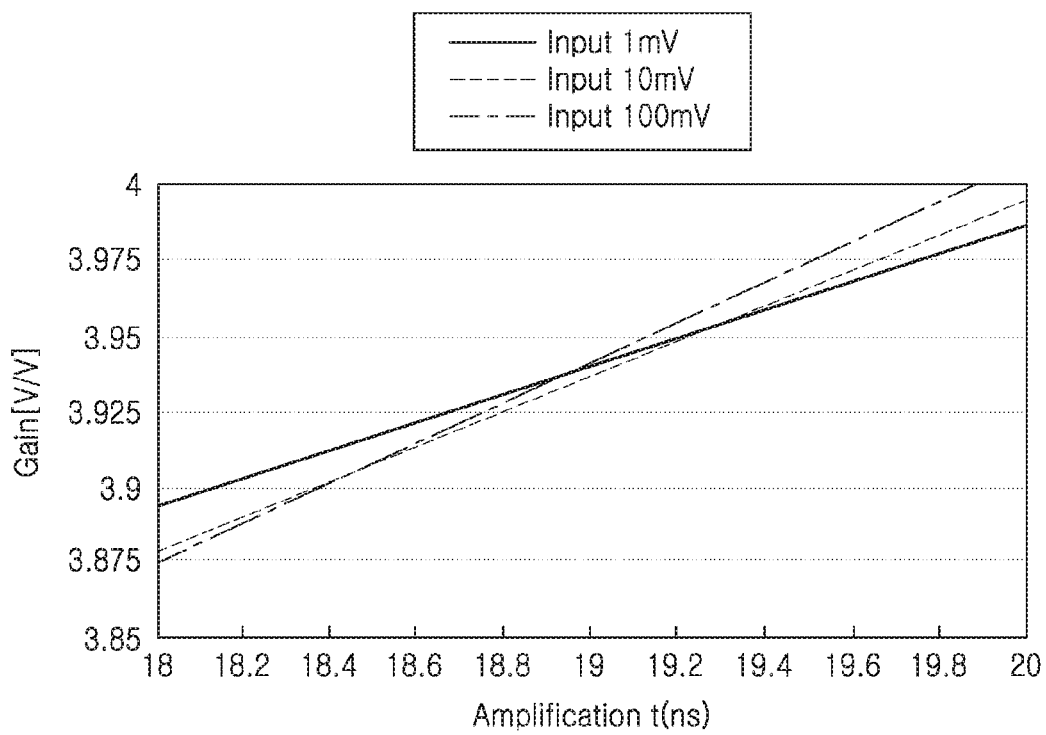
FIGS. 4A and 4B are views illustrating an operation of a dynamic amplifier according to an exemplary embodiment of the present inventive concept.
Figure 4B:
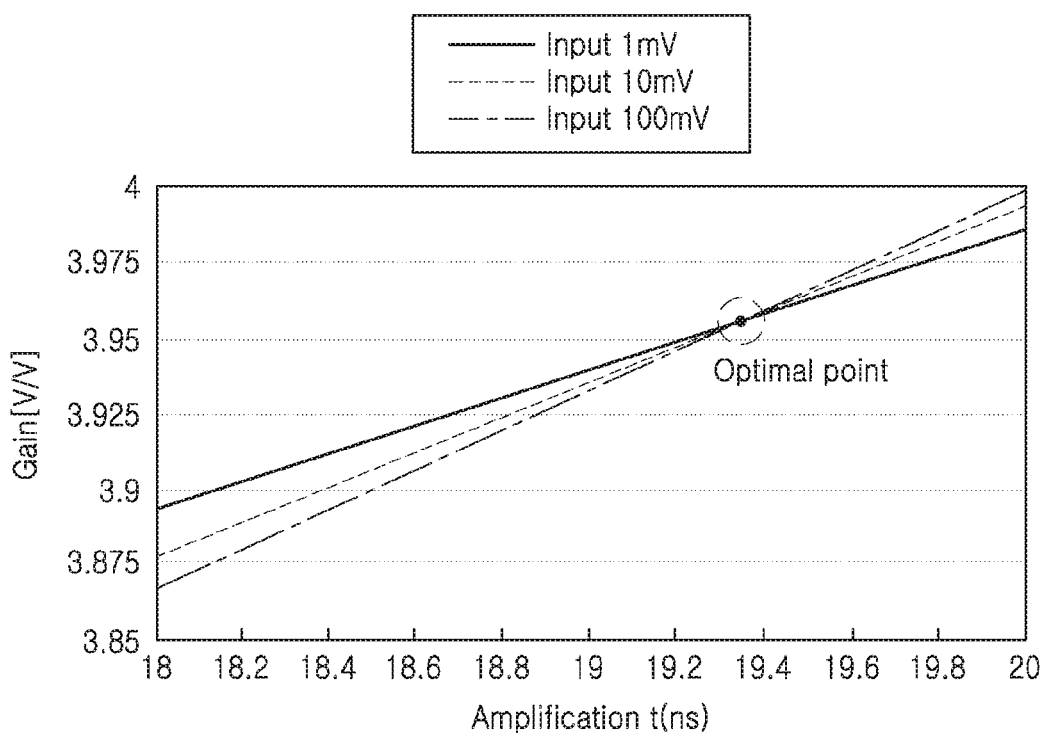

FIGS. 4A and 4B are views illustrating an operation of a dynamic amplifier according to an exemplary embodiment of the present inventive concept. Hereinafter, for convenience of description, the circuit diagram of the dynamic amplifier 100 illustrated in FIG. 1 will be described together with FIGS. 4A and 4B.

FIG. 4A illustrates a case in which the dynamic amplifier 100 has non-linearity, and FIG. 4B illustrates a case in which non-linearity of the dynamic amplifier 100 is improved.

In graphs of FIGS. 4A and 4B, a horizontal axis represents the time at which the dynamic amplifier 100 performs an amplification operation, while a vertical axis represents amplification gain of the dynamic amplifier 100.

First, referring to FIG. 4A, when the dynamic amplifier 100 has non-linearity, an optimal point may not be formed, in which all amplification gain curves with magnitudes of the input signals $V_{IN1}$ and $V_{IN2}$ of 1 mV, 10 mV, and 100 mV meet each other. The dynamic amplifier 100 performs a non-linear amplification operation, and an error (an error of amplification gain) may occur between a target value and an actual value of the amplification gain.

To compensate for an error of amplification gain, the dynamic amplifier 100 changes a degeneration resistance value of the amplifier 130 to adjust the amplification gain of the dynamic amplifier 100, thus compensating for the error of the amplification gain of the dynamic amplifier 100 and improving linearity. As a result of compensating for the error of the amplification gain of the dynamic amplifier 100, as illustrated in FIG. 4B, an optimal point may be formed in an amplification gain curve. Under a bias condition of the optimal point, the amplification efficiency of the dynamic amplifier 100 may be maximized.

Hereinafter, the dynamic amplifier 100 according to an exemplary embodiment of the present inventive concept will be described in more detail with reference to FIGS. 5A to 7C.

Figure 5A:
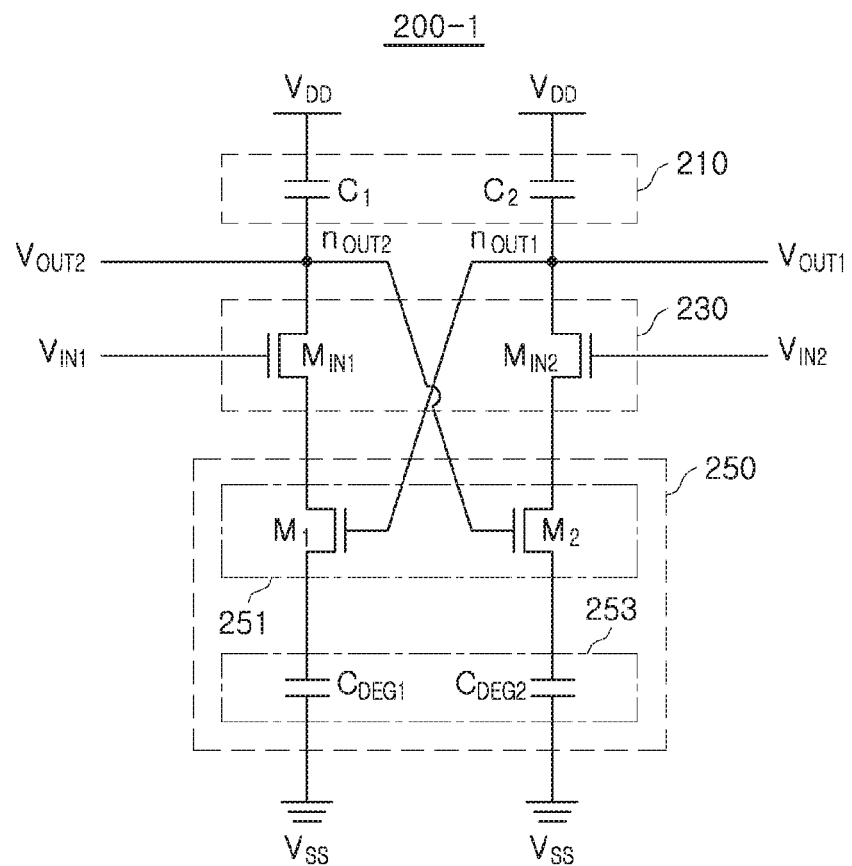
FIGS. 5A, 5B, and 5C are exemplary views illustrating a dynamic amplifier according to exemplary embodiments of the present inventive concept.
Figure 5B:
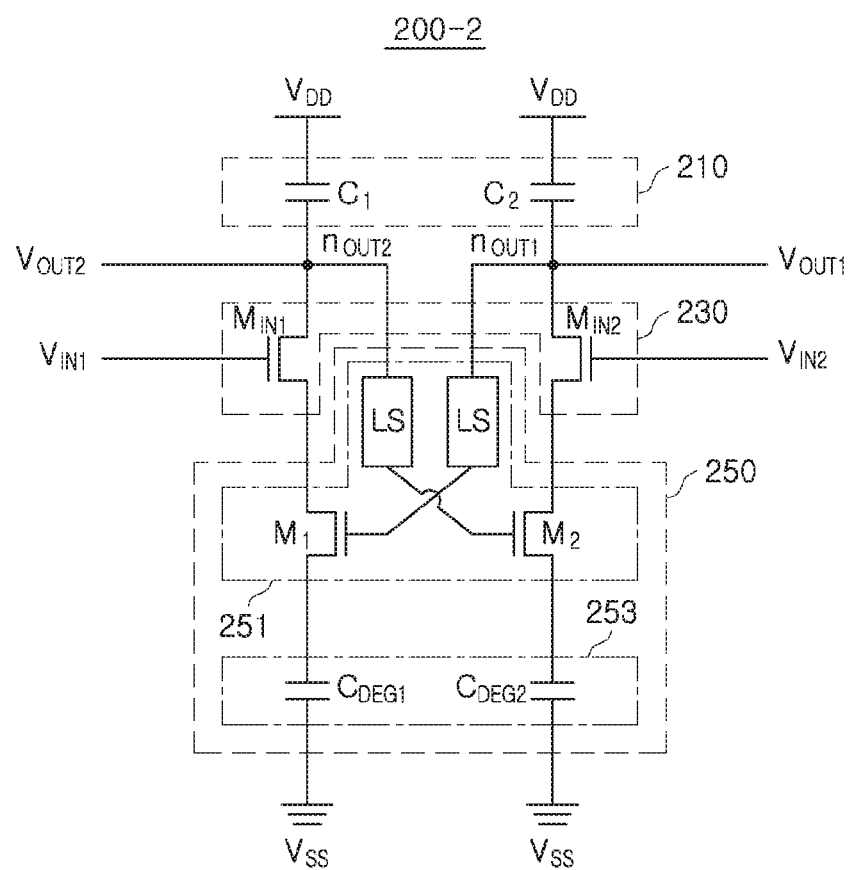
Figure 5C:
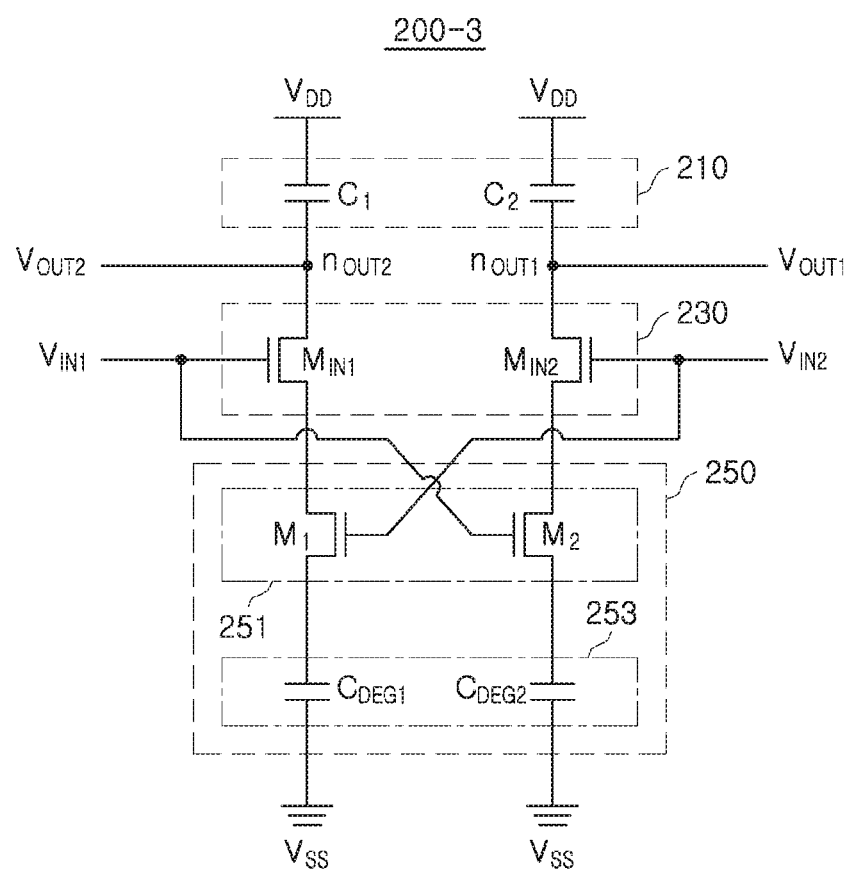
Figure 6:
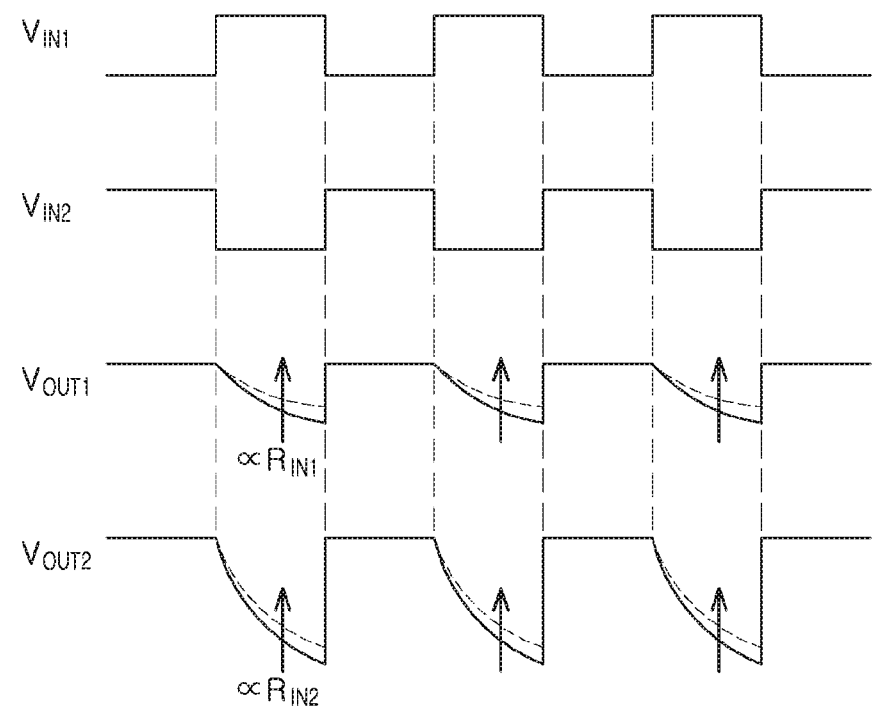
FIG. 6 is an operation waveform diagram of the dynamic amplifier of FIG. 5A according to an exemplary embodiment of the present inventive concept.

FIGS. 5A to 5C are exemplary views illustrating a dynamic amplifier according to exemplary embodiments of the present inventive concept. FIG. 6 is an operation waveform diagram of the dynamic amplifier of FIG. 5A according to an exemplary embodiment of the present inventive concept.

Referring to FIG. 5A, a dynamic amplifier 200-1 may include a bias portion 210, an amplifier 230, and a variable impedance unit 250.

The bias portion 210 may include the first and second bias capacitors $C_1$ and $C_2$. The first bias capacitor $C_1$ may be connected between the first power node $V_{DD}$ supplying the first source voltage and the second output node $n_{OUT2}$. The second bias capacitor $C_2$ may be connected between the first power node $V_{DD}$ supplying the first source voltage and the first output node $n_{OUT1}$. The first and second bias capacitors $C_1$ and $C_2$ may apply bias to the amplifier 230 in a charge sharing method.

The amplifier 230 may include the first and second input transistors $M_{IN1}$ and $M_{IN2}$. The first input transistor $M_{IN1}$ may have a gate receiving the first input signal $V_{IN1}$, a drain connected to the bias portion 210, and a source connected to the variable impedance unit 250. The drain of the first input transistor $M_{IN1}$ may be connected to the second output node $n_{OUT2}$ outputting the second output signal $V_{OUT2}$. The second input transistor $M_{IN2}$ may have a gate receiving the second input signal $V_{IN2}$, a drain connected to the bias portion 210, and a source connected to the variable impedance unit 250. The drain of the second input transistor $M_{IN2}$ may be connected to the first output node $n_{OUT1}$ outputting the first output signal $V_{OUT1}$.

The variable impedance unit 250 may include a non-linearity compensator 251 and an amplification gain control unit 253.

The non-linearity compensator 251 may include first and second feedback transistors $M_1$ and $M_2$ (also referred to as first and second transistors $M_1$ and $M_2$). Moreover, the amplification gain control unit 253 may include first and second capacitors $C_{DEG1}$ and $C_{DEG2}$.

The first feedback transistor $M_1$ may be connected between a source of the first input transistor $M_{IN1}$ and the first capacitor $C_{DEG1}$. The first feedback transistor $M_1$ may have a resistance value which varies according to a magnitude of the first output signal $V_{OUT1}$ received through a gate of the first feedback transistor $M_1$. For example, when the first feedback transistor $M_1$ is an n-type metal oxide semiconductor (NMOS) transistor, a magnitude of the first output signal $V_{OUT1}$ and a resistance value $R_{IN1}$ of the first feedback transistor $M_1$ may be proportional to each other.

The second feedback transistor $M_2$ may be connected between a source of the second input transistor $M_{IN2}$ and the second capacitor $C_{DEG2}$. The second input transistor $M_{IN2}$ may have a resistance value which varies according to a magnitude of the second output signal $V_{OUT2}$ received through a gate of the second feedback transistor $M_2$. For example, when the second feedback transistor $M_2$ is an NMOS transistor, a magnitude of the second output signal $V_{OUT2}$ and a resistance value $R_{IN1}$ of the second feedback transistor $M_2$ may be proportional to each other.

The amplification gain control unit 253 may adjust amplification gain based on a capacitance value of each of the first and second capacitors $C_{DEG1}$ and $C_{DEG2}$. For example, the amplification gain of the amplifier 230 may be increased or decreased in proportion to the capacitance values of each of the first and second capacitors $C_{DEG1}$ and $C_{DEG2}$.

The non-linearity compensator 251 may adjust a resistance value at least one of the first transistor $M_1$ and the second transistor $M_2$, thus compensating for an error of amplification gain. For example, referring to FIG. 6, when the first and second input signals $V_{IN1}$ and $V_{IN2}$, having the same magnitude while having different phases, are applied to the amplifier 230, a magnitude of the first output signal $V_{OUT1}$ is proportional to a resistance value $R_{IN1}$ of the first transistor $M_1$, and a magnitude of the second output signal $V_{OUT2}$ is proportional to a resistance value $R_{IN2}$ of the second transistor $M_2$. When a difference between the resistance value $R_{IN1}$ of the first transistor $M_1$ and the resistance value $R_{IN1}$ of the second transistor $M_2$ is increased, a difference in magnitude between the output signals $V_{OUT1}$ and $V_{OUT2}$ is increased, so amplification gain may be increased. On the other hand, when the difference between the resistance value $R_{IN1}$ of the first transistor $M_1$ and the resistance value $R_{IN2}$ of the second transistor $M_2$ is decreased, the difference in magnitude between the output signals $V_{OUT1}$ and $V_{OUT2}$ is decreased, so the amplification gain may be reduced.

Referring to FIG. 5B, a dynamic amplifier 200-2 may include the bias portion 210, the amplifier 230, and the variable impedance unit 250. In a manner different from FIG. 5A, the non-linearity compensator 251 of the dynamic amplifier 200-2 may further include a level shifter LS connected to a gate of each of the first and second transistors $M_1$ and $M_2$. According to exemplary embodiments of the present inventive concept, the level shifter LS may be a circuit.

The level shifter LS may adjust magnitudes of the output signals $V_{OUT1}$ and $V_{OUT2}$ input to the gates of the first and second transistors $M_1$ and $M_2$, respectively. The dynamic amplifier 200-2 may control gate voltages of the first and second transistors $M_1$ and $M_2$ over a wider range using the level shifter LS, thus more precisely compensating for an error of the amplification gain.

Referring to FIG. 5C, a dynamic amplifier 200-3 may include the bias portion 210, the amplifier 230, and the variable impedance unit 250. In a manner different from FIG. 5A, the first transistor $M_1$ of the dynamic amplifier 200-3 may receive the second input signal $V_{IN2}$ through a gate thereof. In addition, the second transistor $M_2$ of the dynamic amplifier 200-3 may receive the first input signal $V_{IN1}$ through a gate thereof. In a manner similar to FIG. 5B, the dynamic amplifier 200-3 may further include the level shifter LS for adjusting a magnitude of a signal input to the gate of each of the first and second transistors $M_1$ and $M_2$.

In the dynamic amplifiers 200-1, 200-2, and 200-3 of FIGS. 5A to 5C, described above, the non-linearity compensator 251 may be operated in a direction of increasing amplification gain in an amplification section in which magnitudes of the input signals $V_{IN1}$ and $V_{IN2}$ and amplification gain are inversely proportional to each other.

Figure 7A:
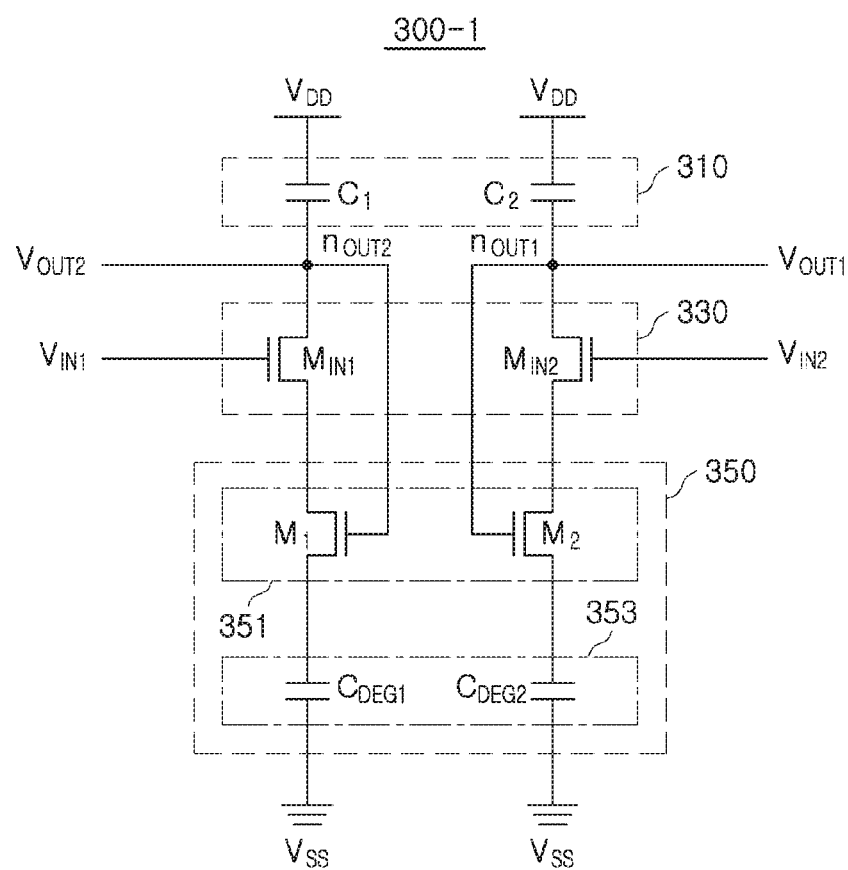
FIGS. 7A, 7B, and 7C are views illustrating a dynamic amplifier according to exemplary embodiments of the present inventive concept.
Figure 7B:
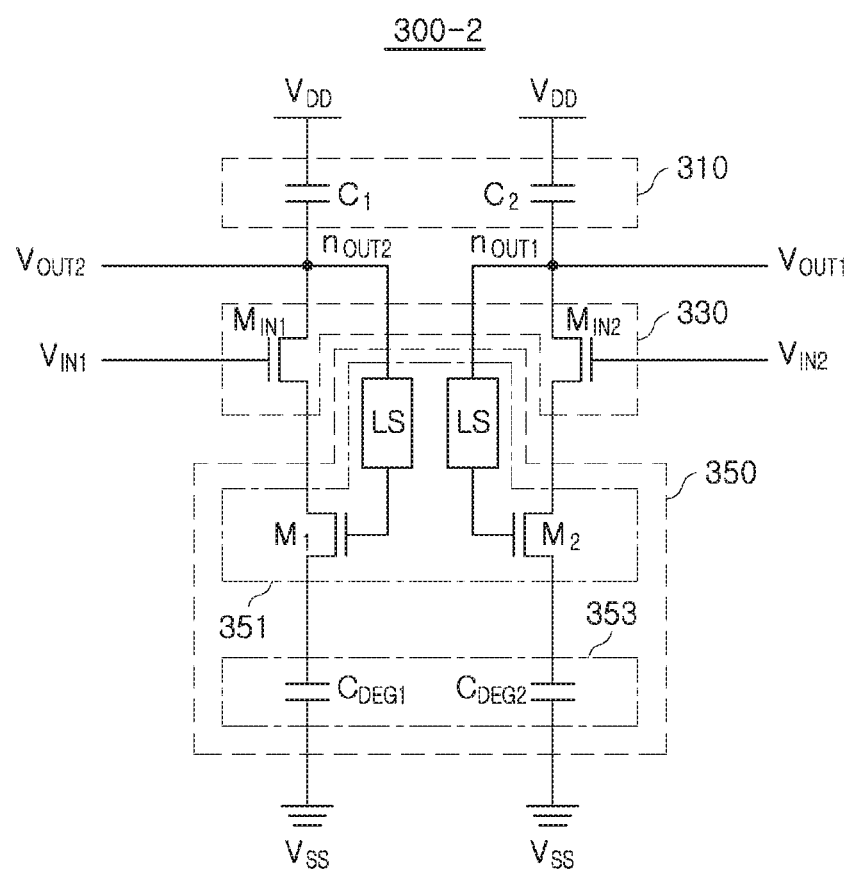
Figure 7C:
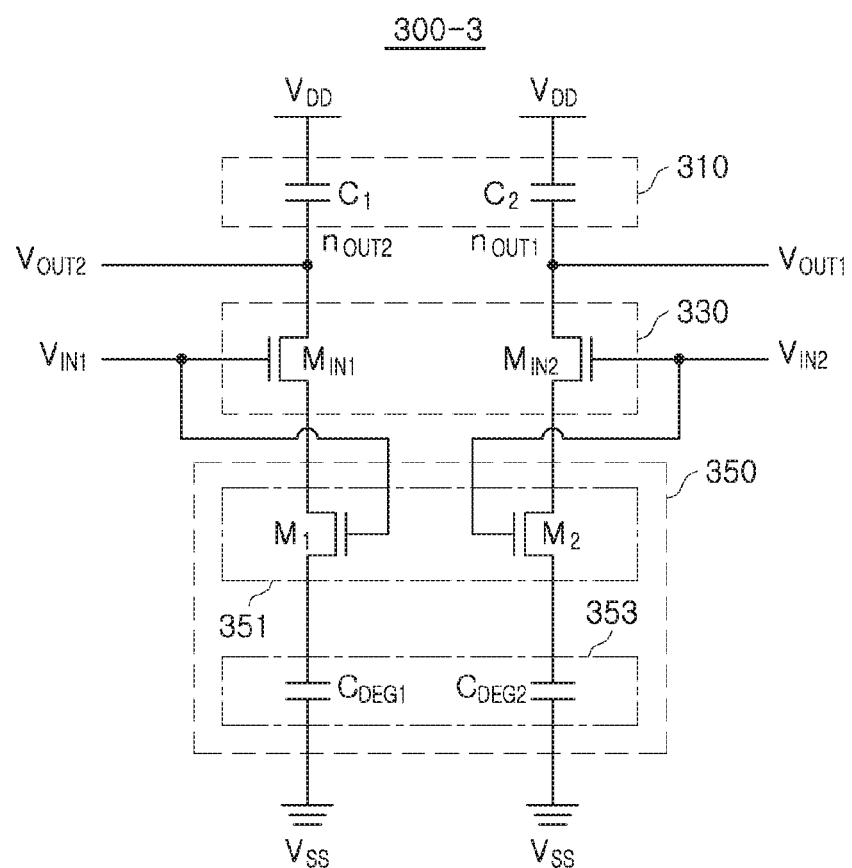

FIGS. 7A to 7C are views illustrating a dynamic amplifier according to exemplary embodiments of the present inventive concept.

Referring to FIG. 7A, a dynamic amplifier 300-1 may include a bias portion 310, an amplifier 330, and a variable impedance unit 350.

The bias portion 310 may include the first and second bias capacitors C1 and C2. The first bias capacitor $C_1$ may be connected between the first power node $V_{DD}$ supplying the first source voltage and the second output node $n_{OUT2}$. The second bias capacitor $C_2$ may be connected between the first power node $V_{DD}$ supplying the first source voltage and the first output node $n_{OUT1}$. The first and second bias capacitors $C_1$ and $C_2$ may apply bias to the amplifier 330 in a charge sharing method.

The amplifier 330 may include the first and second input transistors $M_{IN1}$ and $M_{IN2}$. The first input transistor $M_{IN1}$ may have a gate receiving the first input signal $V_{IN1}$, a drain connected to the bias portion 310, and a source connected to the variable impedance unit 350. The drain of the first input transistor $M_{IN1}$ may be connected to the second output node $n_{OUT2}$, from which the second output signal $V_{OUT2}$ is outputted. The second input transistor $M_{IN2}$ may have a gate receiving the second input signal $V_{IN2}$, a drain connected to the bias portion 310, and a source connected to the variable impedance unit 350. The drain of the second input transistor $M_{IN2}$ may be connected to the first output node $n_{OUT1}$ outputting the first output signal $V_{OUT1}$.

The variable impedance unit 350 may include a non-linearity compensator 351 and an amplification gain control unit 353.

The non-linearity compensator 351 may include the first and second transistors $M_1$ and $M_2$. Moreover, the amplification gain control unit 353 may include the first and second capacitors $C_{DEG1}$ and $C_{DEG2}$.

The first transistor $M_1$ may be connected between the source of the first input transistor $M_{IN1}$ and the first capacitor $C_{DEG1}$. The first transistor $M_1$ may have a resistance value $R_{IN1}$ which varies according to a magnitude of the second output signal $V_{OUT2}$ received through a gate of the first transistor $M_1$. For example, when the first transistor $M_1$ is an NMOS transistor, a magnitude of the second output signal $V_{OUT2}$ and the resistance value $R_{IN1}$ of the first transistor $M_1$ may be proportional to each other.

The second transistor $M_2$ may be connected between the source of the second input transistor $M_{IN2}$ and the second capacitor $C_{DEG2}$. The second transistor $M_2$ may have a resistance value $R_{IN2}$ which varies according to a magnitude of the first output signal $V_{OUT1}$ received through a gate of the second transistor $M_2$. For example, when the second transistor $M_2$ is an NMOS transistor, a magnitude of the first output signal $V_{OUT1}$ and the resistance value $R_{IN2}$ of the second transistor $M_2$ may be proportional to each other.

The amplification gain control unit 353 may adjust amplification gain based on a capacitance value of each of the first and second capacitors $C_{DEG1}$ and $C_{DEG2}$. For example, the amplification gain of the amplifier 330 may be increased or decreased, in proportion to the capacitance values of each of the first and second capacitors $C_{DEG1}$ and $C_{DEG2}$.

The non-linearity compensator 351 adjusts a resistance value of at least one of the first transistor $M_1$ and the second transistor $M_2$, thus adjusting the amplification gain of the amplifier 330 so as to compensate for a difference (an error of the amplification gain) between a target value and an actual value of the amplification gain of the amplifier 330. In an exemplary embodiment of the present inventive concept, the amplification gain of the amplifier 330 may be inversely proportional to the resistance value $R_{IN1}$ of the first transistor $M_1$, and may be proportional to the resistance value $R_{IN2}$ of the second transistor $M_2$.

Referring to FIG. 7B, a dynamic amplifier 300-2 may include the bias portion 310, the amplifier 330, and the variable impedance unit 350. In a manner different from FIG. 7A, the non-linearity compensator 351 of the dynamic amplifier 300-2 may further include the level shifter LS connected to a gate of each of the first and second transistors $M_1$ and $M_2$. The level shifter LS may adjust magnitudes of the output signals $V_{OUT1}$ and $V_{OUT2}$ input to the gates of the first and second transistors $M_1$ and $M_2$, respectively. The dynamic amplifier 300-2 may increase a range of the resistance values $R_{IN1}$ and $R_{IN2}$ of the first and second transistors $M_1$ and $M_2$ using the level shifter LS, thus more precisely compensating for an error of amplification gain.

Referring to FIG. 7C, a dynamic amplifier 300-3 may include the bias portion 310, the amplifier 330, and the variable impedance unit 350. In a manner different from FIG. 7A, the first transistor $M_1$ of the dynamic amplifier 300-3 may receive the first input signal $V_{IN1}$ through a gate of the first transistor $M_1$. In addition, the second transistor $M_2$ of the dynamic amplifier 300-3 may receive the second input signal $V_{IN2}$ through a gate of the second transistor $M_2$.

In the dynamic amplifiers 300-1, 300-2, and 300-3 of FIGS. 7A to 7C, described above, the non-linearity compensator 351 may be operated in a direction of decreasing amplification gain in an amplification section in which magnitudes of the input signals $V_{IN1}$ and $V_{IN2}$ and amplification gain are proportional to each other.

Figure 8:
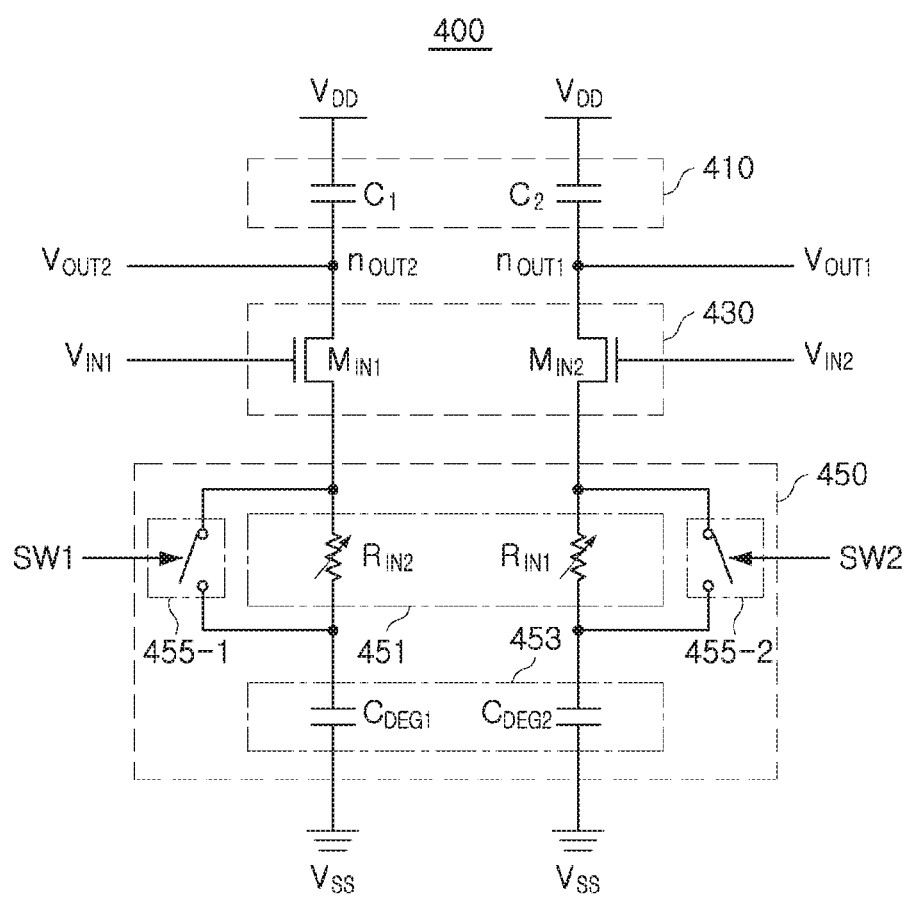
FIG. 8 is a view illustrating a dynamic amplifier according to an exemplary embodiment of the present inventive concept.

FIG. 8 is a view illustrating a dynamic amplifier according to an exemplary embodiment of the present inventive concept.

Referring to FIG. 8, a dynamic amplifier 400 may include a bias portion 410, an amplifier 430, and a variable impedance unit 450.

The bias portion 410 may be connected between the first power node $V_{DD}$ supplying the first source voltage and the amplifier 430, to apply bias to the amplifier 430. In an exemplary embodiment of the present inventive concept, the bias portion 410 may include the first bias capacitor $C_1$ and the second bias capacitor $C_2$, each being connected between the first power node $V_{DD}$ and the amplifier 430. The first bias capacitor $C_1$ and the second bias capacitor $C_2$ may apply bias to the amplifier 430 in a charge sharing method, and as a result, power consumption of the dynamic amplifier 400 may be reduced.

The amplifier 430 is operated by receiving the bias from the bias portion 410, and may differentially amplify the first and second input signals $V_{IN1}$ and $V_{IN2}$ to generate the first and second output signals $V_{OUT1}$ and $V_{OUT2}$.

In an exemplary embodiment of the present inventive concept, the amplifier 430 may include the first input transistor $M_{IN1}$ and the second input transistor $M_{IN2}$. The first input transistor $M_{IN1}$ may have a gate receiving the first input signal $V_{in1}$, a drain connected to the bias portion 410, and a source connected to the variable impedance unit 450. The drain of the first input transistor $M_{IN1}$ may be connected to the second output node $n_{OUT2}$ where the second output signal $V_{OUT2}$ is output. The second input transistor $M_{IN2}$ may have a gate receiving the second input signal $V_{IN2}$, a drain connected to the bias portion 410, and a source connected to the variable impedance unit 450. The drain of the second input transistor $M_{IN2}$ may be connected to the first output node $n_{OUT1}$ where the first output signal $V_{OUT1}$ is output.

The variable impedance unit 450 may be connected between the amplifier 430, and a second power node $V_{SS}$ supplying the second source voltage, lower than the first source voltage. The variable impedance unit 450 may adjust resistance values $R_{IN1}$ and $R_{IN2}$ between the amplifier 430 and the second power node $V_{SS}$, based on a magnitude of one among the first and second input signals $V_{IN1}$ and $V_{IN2}$, input to the amplifier 430, and the first and second output signals $V_{OUT1}$ and $V_{OUT2}$, output from the amplifier 430, thus adjusting amplification gain.

The variable impedance unit 450 may include a non-linearity compensator 451, an amplification gain control unit 453, and an operational mode controller 455.

The non-linearity compensator 451 may adjust resistance values $R_{IN1}$ and $R_{IN2}$ between the amplifier 430 and the second power node $V_{SS}$ to reduce a change in slope factor of the amplification gain of the amplifier 430, thus compensating for an error (an error of the amplification gain) between a target value and an actual value of the amplification gain of the amplifier 430.

The non-linearity compensator 451 may include variable resistive elements $R_{IN1}$ and $R_{IN2}$, in which a resistance value is changed based on one among a pair of the output signals $V_{OUT1}$ and $V_{OUT2}$ and a pair of the input signals $V_{IN1}$ and $V_{IN2}$ of the amplifier 430. For example, the non-linearity compensator 451 may include a passive element such as a variable resistor or an inductor, or an active element such as a transistor.

The non-linearity compensator 451 may include a first variable resistive element $R_{IN1}$ and a second variable resistive element $R_{IN2}$. The first variable resistive element $R_{IN1}$ may control current flowing between the second output node $n_{OUT2}$ and the second power node $V_{SS}$ to adjust a magnitude of the second output signal $V_{OUT2}$. The second variable resistive element $R_{IN2}$ may control current flowing between the first output node $n_{OUT1}$ and the second power node $V_{SS}$ to adjust a magnitude of the first output signal $V_{OUT1}$.

The non-linearity compensator 451 may adjust the amplification gain, by adjusting a magnitude of at least one of the first output signal $V_{OUT1}$ and the second output signal $V_{OUT2}$ based on a resistance value of at least one of the first variable resistive element $R_{IN1}$ and the second variable resistive element $R_{IN2}$. The non-linearity compensator 451 changes resistance values of the variable resistive elements $R_{IN1}$ and $R_{IN2}$ to increase or decrease the amplification gain, thus compensating for an error of the amplification gain and improving linearity of the dynamic amplifier 400.

The amplification gain control unit 453 may adjust the amplification gain using a reactance component between the amplifier 430 and the second power node $V_{SS}$. The amplification gain control unit 453 may include a reactance element such as a capacitor, an inductor, or the like.

The operational mode controller 455 may be connected to the non-linearity compensator 451 in parallel to control whether the non-linearity compensator 451 is activated.

In an exemplary embodiment of the present inventive concept, the operational mode controller 455 may activate the non-linearity compensator 451, when total harmonic distortion (THD) of the dynamic amplifier 400 is lower than a preset threshold. On the other hand, the operational mode controller 455 may deactivate the non-linearity compensator 451, when the THD of the dynamic amplifier 400 is greater than or equal to the preset threshold. The preset threshold of the operational mode controller 455 may vary depending on requirements of an electronic device in which the dynamic amplifier 400 is used. For example, when the dynamic amplifier 400 is used in an audio device, the threshold of the operational mode controller 455 may be a THD of 80 dB.

The operational mode controller 455 may include a first operational mode controller 455-1 and a second operational mode controller 455-2, and be implemented as a switching element such as a transistor. In this case, the operational mode controller 455 may be operated according to first and second operational mode control signals SW1 and SW2. When the first operational mode control signal SW1 has a logic-high value, the first operational mode controller 455-1 is turned-on, so the second resistance value $R_{IN2}$ of the non-linearity compensator 451 may vary. When the second operational mode control signal SW2 has a logic-high value, the second operational mode controller 455-2 is turned-on, so the first resistance value $R_{IN1}$ of the non-linearity compensator 451 may vary. The first and second operational mode control signals SW1 and SW2 may be generated by an internal logic of the dynamic amplifier 400 or a processor outside the dynamic amplifier 400, based on the first and second output signals $V_{OUT1}$ and $V_{OUT2}$.

Hereinafter, referring to FIGS. 9A to 9C, specific examples of a dynamic amplifier according to exemplary embodiments of the present inventive concept will be described in detail.

Figure 9A:
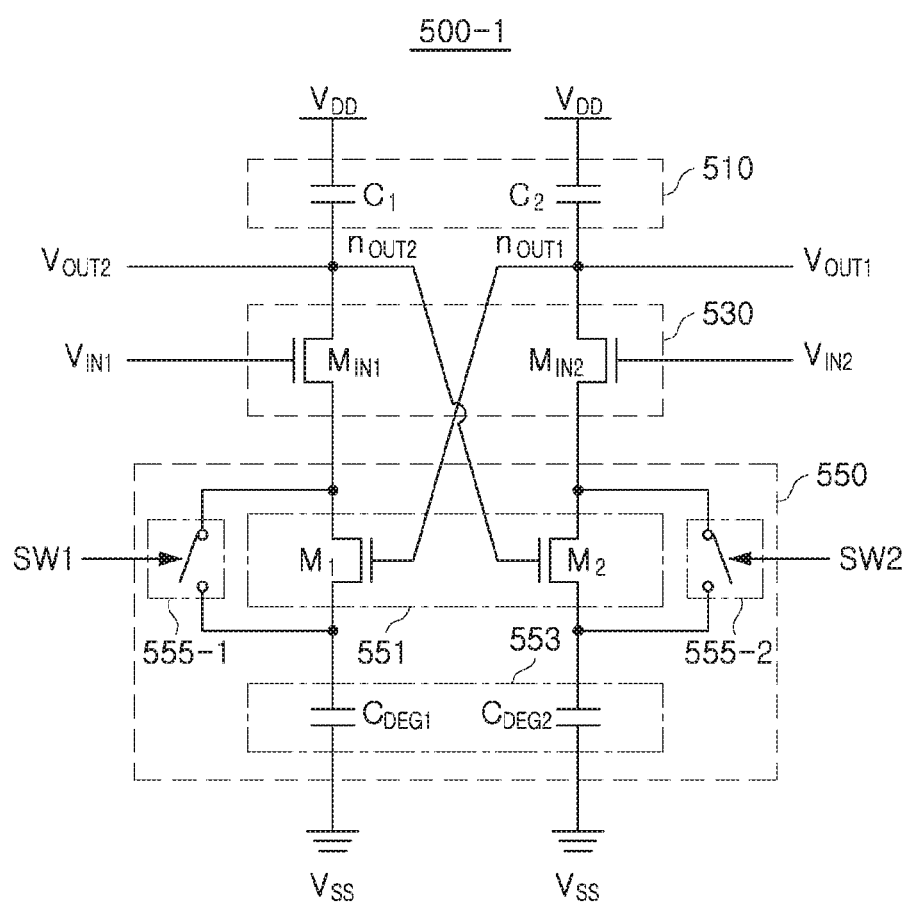
FIGS. 9A, 9B, and 9C are views illustrating a dynamic amplifier according to exemplary embodiments of the present inventive concept.
Figure 9B:
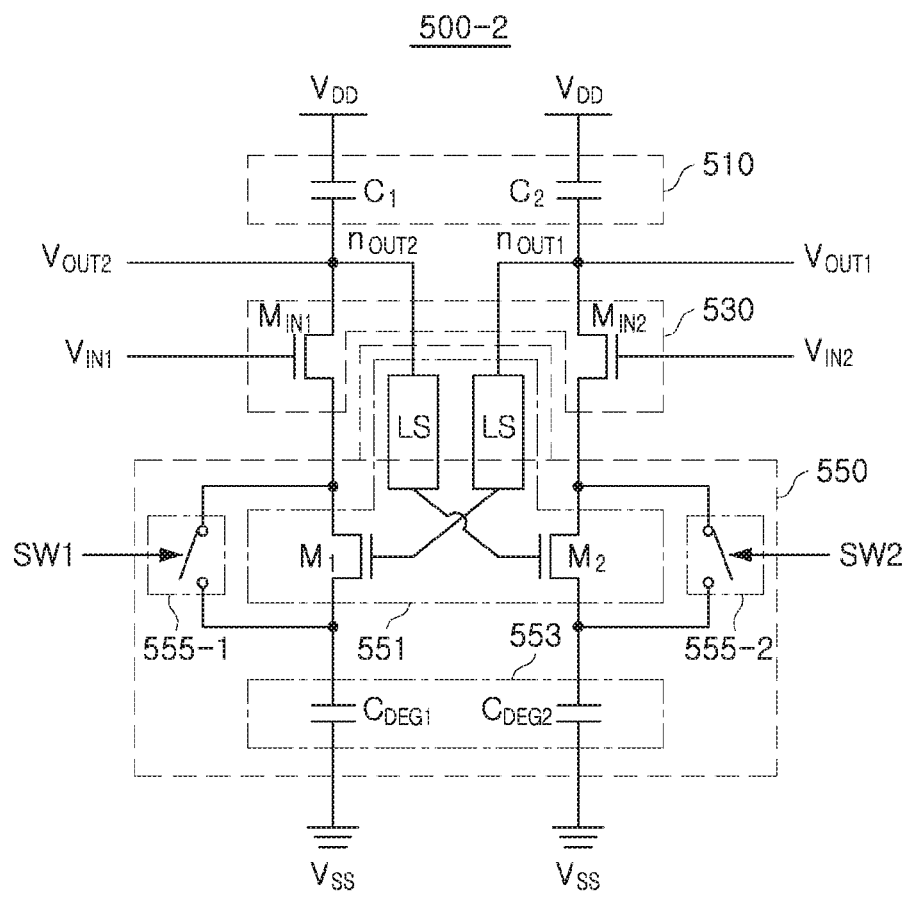
Figure 9C:
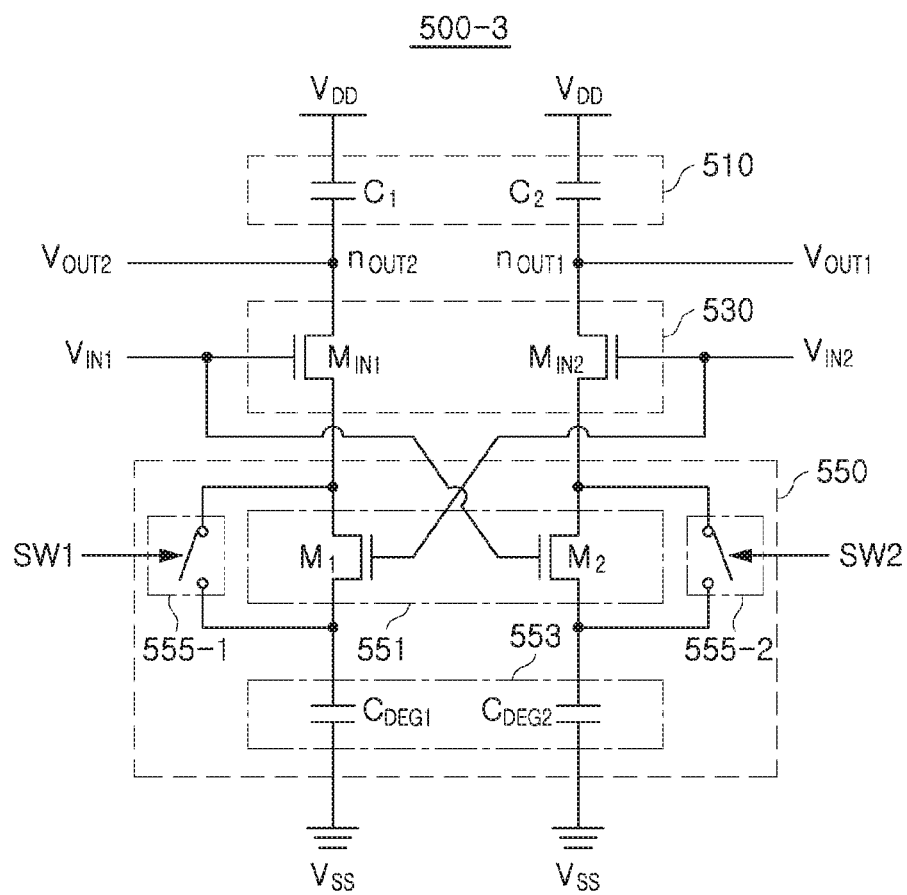

FIGS. 9A to 9C are views illustrating a dynamic amplifier according to exemplary embodiments of the present inventive concept.

Referring to FIG. 9A, a dynamic amplifier 500-1 may include a bias portion 510, an amplifier 530, and a variable impedance unit 550 including a non-linearity compensator 551 and an amplification gain control unit 553. A detailed configuration and function of the bias portion 510 to the variable impedance unit 550 of the dynamic amplifier 500-1 may be substantially the same as that of the dynamic amplifier 200-1 described previously with reference to FIG. 5A.

The variable impedance unit 550 includes the first and second transistors $M_1$ and $M_2$ as variable resistive elements, where the first transistor $M_1$ is operated according to the second output signal $V_{OUT2}$, and the second transistor $M_2$ is operated according to the first output signal $V_{OUT1}$. The dynamic amplifier 500-1 may adjust resistance values of the first and second transistors $M_1$ and $M_2$, thus removing an error occurring in the amplification gain of the amplifier 530.

In addition, the dynamic amplifier 500-1 may further include first and second operational mode controllers 555-1 and 555-2. The first and second operational mode controllers 555-1 and 555-2 may be connected in parallel to the first and second transistors $M_1$ and $M_2$ of the variable impedance unit 550, respectively. The first and second operational mode controllers 555-1 and 555-2 may be implemented as switching elements such as transistors, and may be operated according to the operational mode control signals SW1 and SW2.

When the first operational mode control signal SW1 has a logic-high value, the first operational mode controller 555-1 is turned-on to deactivate a function of the first transistor $M_1$. When the second operational mode control signal SW2 has a logic-high value, the second operational mode controller 555-2 is turned-on to deactivate a function of the second transistor $M_2$.

On the other hand, when the first operational mode control signal SW1 has a logic-low value, the first operational mode controller 555-1 is turned-off to activate a function of the first transistor $M_1$. When the second operational mode control signal SW2 has a logic-low value, the second operational mode controller 555-2 is turned-off to activate a function of the second transistor $M_2$.

The activation timing of the first transistor $M_1$ and the second transistor $M_2$ may be the same or may be different from each other. For example, when amplification gain is increased to compensate for an error of the amplification gain, only the second transistor $M_2$ may be activated to increase a magnitude of the first output signal $V_{OUT1}$. In addition, when amplification gain is decreased to compensate for an error of the amplification gain, only the first transistor $M_1$ may be activated to increase a magnitude of the second output signal $V_{OUT2}$.

Referring to FIG. 9B, a dynamic amplifier 500-2 may further include the level shifter LS connected to a gate of each of the first and second transistors M1 and M2. As the dynamic amplifier 500-2 may further include the level shifter LS, a variable range of the resistance value $R_{IN1}$ of the first transistor $M_1$ and the resistance value $R_{IN2}$ of the second transistor $M_2$ is expanded to more precisely compensate for an error of the amplification gain.

Referring to FIG. 9C, in a dynamic amplifier 500-3, similar to the dynamic amplifier 500-2 of FIG. 5C, the second input signal $V_{IN2}$ is input to a gate of the first transistor $M_1$, and the first input signal $V_{IN1}$ is input to a gate of the second transistor $M_2$.

As described above, the dynamic amplifiers 500-1, 500-2, and 500-3 of FIGS. 9A to 9C may be operated in a direction of increasing amplification gain in an amplification section in which magnitudes of the input signals $V_{IN1}$ and $V_{IN2}$ and the amplification gain are inversely proportional to each other.

Meanwhile, the dynamic amplifiers 500-1, 500-2, and 500-3 of FIGS. 9A to 9C may be modified, so a gate of the first transistor $M_1$ receives the second output signal $V_{OUT2}$ or the first input signal $V_{IN1}$, and a gate of the second transistor $M_2$ receives the first output signal $V_{OUT1}$ or the second input signal $V_{IN2}$, as described with reference to FIGS. 7A to 7C. In this case, the dynamic amplifiers 500-1, 500-2, and 500-3 may be operated in a direction of increasing amplification gain in an amplification section in which magnitudes of the input signals $V_{IN1}$ and $V_{IN2}$ and the amplification gain are proportional to each other.

FIGS. 10A to 13 are views illustrating a simulation result of a dynamic amplifier according to exemplary embodiments of the present inventive concept.

Figures 10A, 10B:
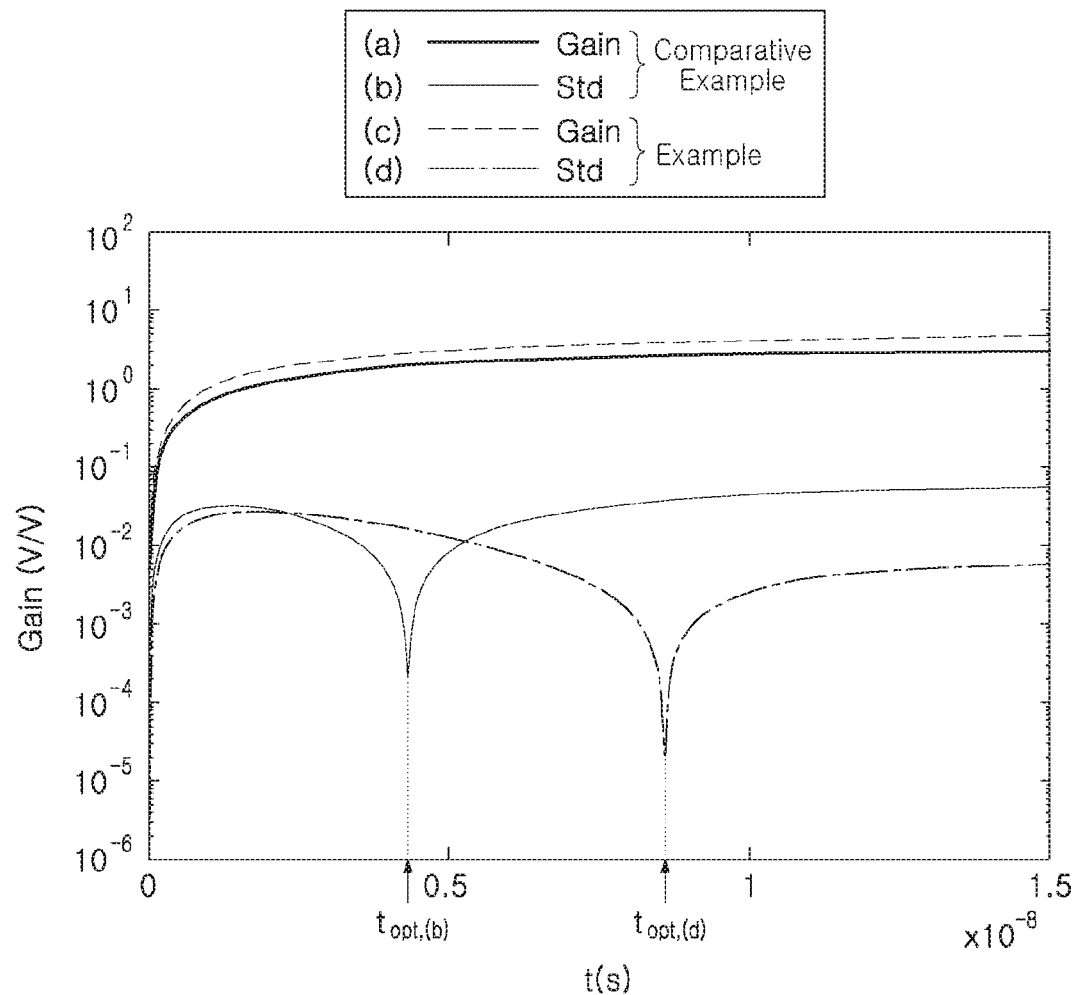
FIGS. 10A, 10B, 11A, 11B, 12, and 13 are views illustrating a simulation result of a dynamic amplifier according to exemplary embodiments of the present inventive concept.

FIG. 10A illustrates a change in amplification gain of a dynamic amplifier, and FIG. 10B illustrates simulation result values of FIG. 10A. In a graph of FIG. 10A, a horizontal axis represents the time at which a dynamic amplifier performs an amplification operation, while a vertical axis represents amplification gain of the dynamic amplifier.

In FIG. 10A, curves (a) and (b) represent a magnitude and a standard deviation of amplification gain of a dynamic amplifier, respectively, according to a comparative example of the related art, while curves (c) and (d) represent a magnitude and a standard deviation of amplification gain of a dynamic amplifier, respectively, according to an exemplary embodiment of the present inventive concept.

Referring to FIGS. 10A and 10B, a magnitude of amplification gain (2.6297 V/V) of a dynamic amplifier according to an exemplary embodiment of the present inventive concept may be smaller by about 6.8%, as compared with amplification gain (2.8229 V/V) of a dynamic amplifier according to the related art.

In addition, a standard deviation ($8.1484\ e^{-6}$) of amplification gain of the dynamic amplifier according to an exemplary embodiment of the present inventive concept may be improved about 8.7472 times, as compared with a standard deviation ($7.1276\ e^{-5}$) of the amplification gain of a dynamic amplifier according to the related art.

In the case of the dynamic amplifier according to an exemplary embodiment of the present inventive concept, as compared with the dynamic amplifier according to the related art, the time, for which an optimal point $t_{opt}$ is shifted (from 4.3 ns to 8.6 ns) to perform an amplification operation, is increased. Linearity is increased and thus amplification efficiency is also increased.

Figures 11A, 11B:
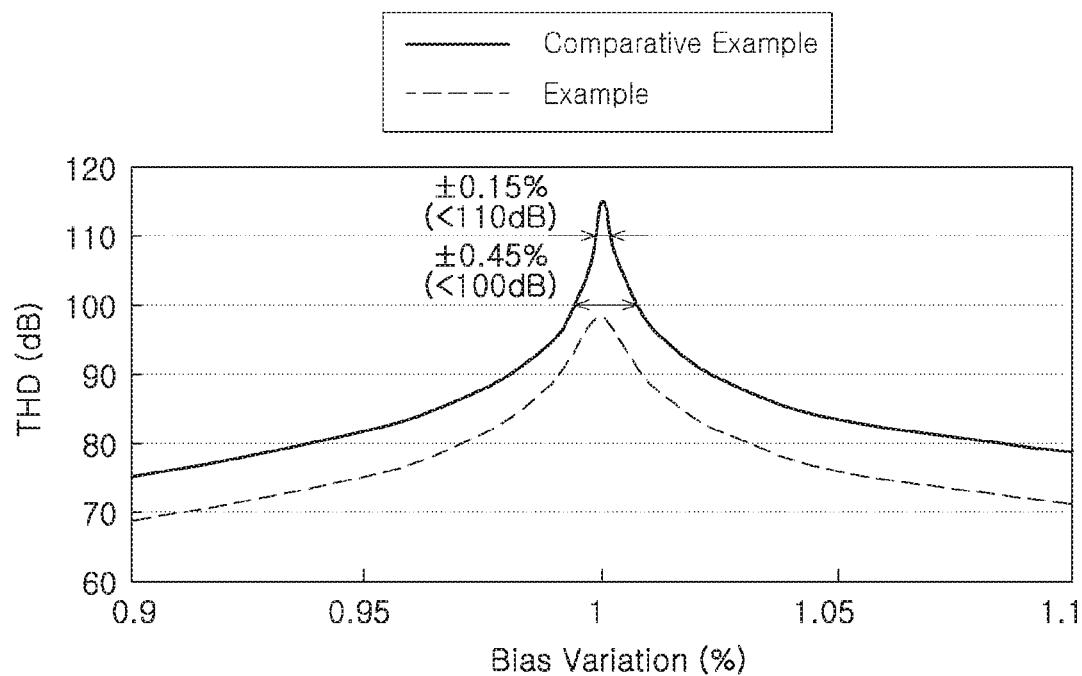
Figure 12:
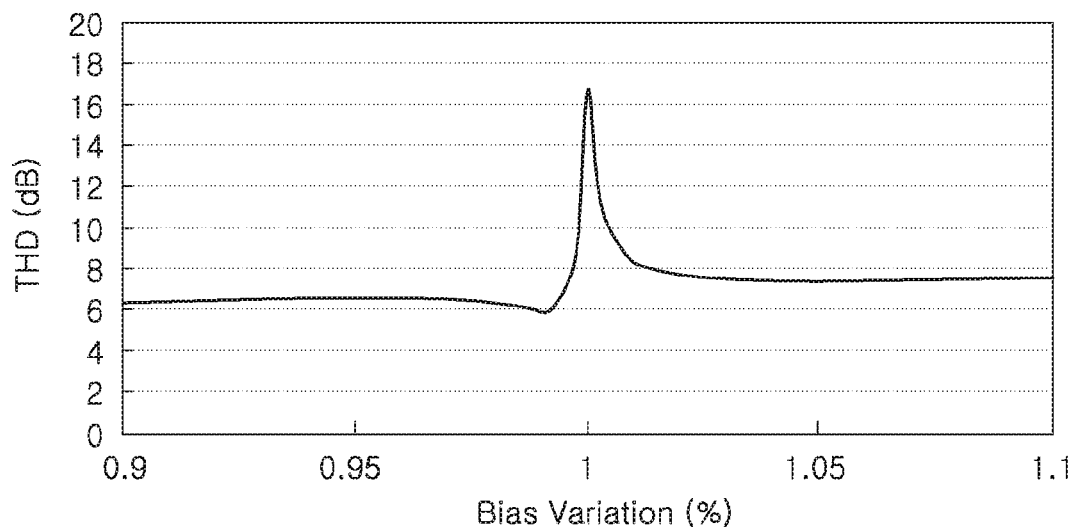

FIGS. 11A to 12 illustrate a change in total harmonic distortion (THD) according to a bias variation of a dynamic amplifier. In graphs of FIGS. 11A and 12, a horizontal axis represents a variable of the bias applied to the dynamic amplifier, while a vertical axis represents THD of the dynamic amplifier. FIG. 11B illustrates simulation result values of FIG. 11A.

Referring to FIGS. 11A and 11B, in the dynamic amplifier according to an exemplary embodiment of the present inventive concept, as compared with the dynamic amplifier according to the related art, linearity is increased, so a peak of the THD is increased (from 90 dB to 110 dB). In addition, in the dynamic amplifier according to an exemplary embodiment of the present inventive concept, as compared with the dynamic amplifier according to the related art, a width of the THD is increased (from 0.95% to 1.90% at 90 dB), so the correlation between a variable of bias and occurrence of an error in amplification gain may be smaller.

Referring to FIG. 12, a difference in THD between the dynamic amplifier according to an exemplary embodiment of the present inventive concept and the dynamic amplifier according to the related art may be up to 16.61 dB.

Figure 13:
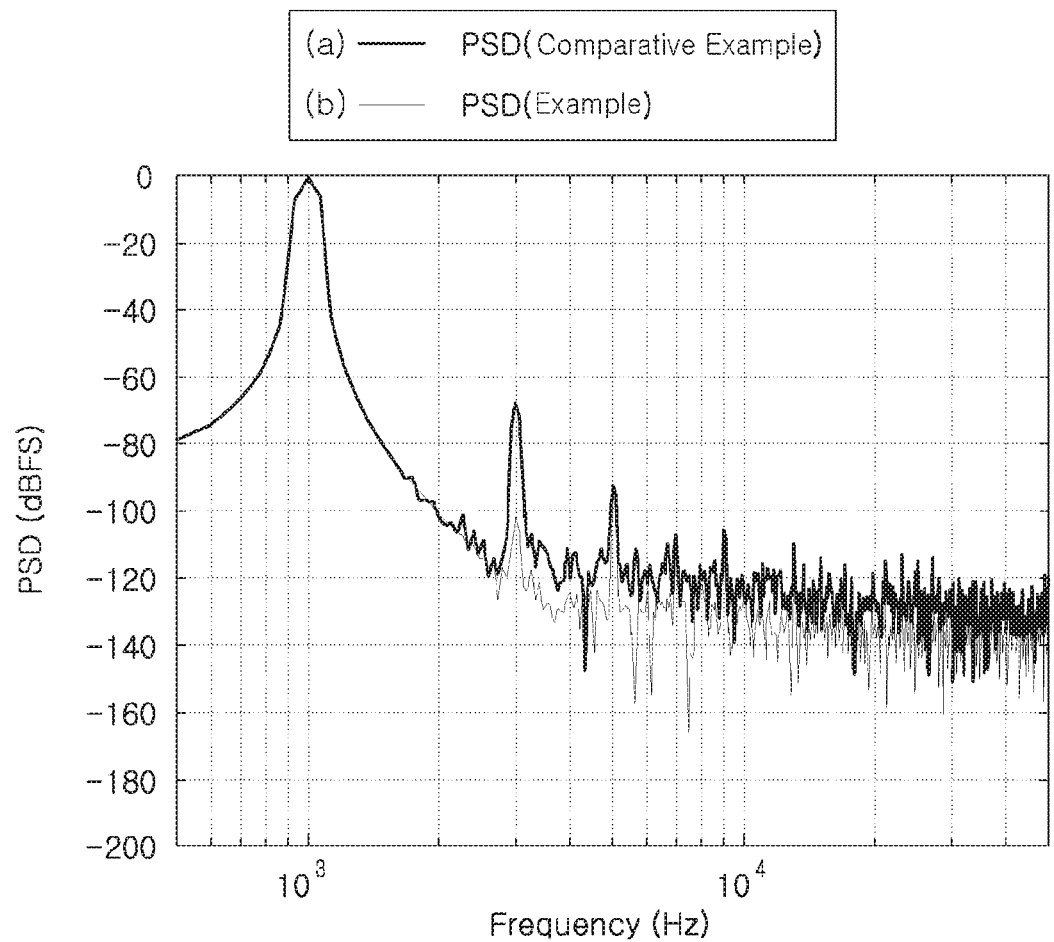

FIG. 13 illustrates a power spectrum density (PSD) of a dynamic amplifier. In a graph of FIG. 13, a horizontal axis represents an operating frequency of the dynamic amplifier, while a vertical axis represents power consumption of the dynamic amplifier.

In FIG. 13, a curve (a) represents the case of the dynamic amplifier according to the related art, while a curve (b) represents the case of the dynamic amplifier according to an exemplary embodiment of the present inventive concept.

Referring to FIG. 13, in a high frequency range (>$2\times10^3$ Hz), as compared with the dynamic amplifier according to the related art, the PSD of the dynamic amplifier according to an exemplary embodiment of the present inventive concept is reduced, so power efficiency is improved.

As set forth above, according to exemplary embodiments of the present inventive concept, a dynamic amplifier includes a variable resistive element in which a resistance value varies based on at least one of a differential input signal and an output signal, so linearity may be improved.

According to exemplary embodiments of the present inventive concept, a dynamic amplifier is biased in a charge sharing method, so power consumption may be reduced.

According to exemplary embodiments of the present inventive concept, a dynamic amplifier selectively performs a non-linearity compensation operation, so an operation speed may be faster.

While the present inventive concept has been shown and described above with reference to exemplary embodiments thereof, it will be apparent to those of ordinary skill in the art that modifications and variations in form and details could be made thereto without departing from the spirit and scope of the present inventive concept, as set forth by the appended claims.

What is claimed is:

1. A dynamic amplifier, comprising:
a first input transistor having a gate configured to receive a first input signal and a drain configured to output a second output signal;
a second input transistor having a gate configured to receive a second input signal and a drain configured to output a first output signal;
a first feedback transistor having a drain connected to a source of the first input transistor, and having a resistance value determined by one among the first and second input signals and the first and second output signals;
a second feedback transistor having a drain connected to a source of the second input transistor, and having a resistance value determined by one among the first and second input signals and the first and second output signals;
a first capacitor connected to a source of the first feedback transistor; and
a second capacitor connected to a source of the second feedback transistor.

2. The dynamic amplifier of claim 1, further comprising:
a first bias capacitor connected between a first power node configured to supply a first source voltage and the drain of the first input transistor; and
a second bias capacitor connected between the first power node and the drain of the second input transistor.

3. The dynamic amplifier of claim 1, wherein a gate of the first feedback transistor is connected to the drain of the second input transistor, and a gate of the second feedback transistor is connected to the drain of the first input transistor.

4. The dynamic amplifier of claim 1, wherein a gate of the first feedback transistor is connected to a first output node of the first output signal, and a gate of the second feedback transistor is connected to a second output node of the second output signal.

5. The dynamic amplifier of claim 1, further comprising:
a first level shifter circuit connected between a gate of the first feedback transistor and the drain of the second input transistor; and
a second level shifter circuit connected between a gate of the second feedback transistor and the drain of the first input transistor.

6. The dynamic amplifier of claim 1, wherein a resistance value of the first feedback transistor is adjusted to be lower than a resistance value of the second feedback transistor, when a difference in magnitude between the first and second output signals is proportional to magnitudes of the first and second input signals.

7. The dynamic amplifier of claim 1, wherein a resistance value of the first feedback transistor is adjusted to be greater than a resistance value of the second feedback transistor, when a difference in magnitude between the first and second output signals is inversely proportional to magnitudes of the first and second input signals.

* * * * *